United States Patent
Brioschi et al.

(10) Patent No.: US 9,769,554 B2
(45) Date of Patent: Sep. 19, 2017

(54) SEMICONDUCTOR INTEGRATED DEVICE FOR ACOUSTIC APPLICATIONS WITH CONTAMINATION PROTECTION ELEMENT, AND MANUFACTURING METHOD THEREOF

(71) Applicants: STMICROELECTRONICS S.R.L., Agrate Brianza (IT); STMICROELECTRONICS (MALTA) LTD, Kirkop (MT)

(72) Inventors: Roberto Brioschi, Sesto San Giovanni (IT); Silvia Adorno, Novate Milanese (IT); Kenneth Fonk, San Gwann (MT)

(73) Assignees: STMICROELECTRONICS (MALTA) LTD, Kirkop (MT); STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/943,848

(22) Filed: Nov. 17, 2015

(65) Prior Publication Data

US 2016/0261941 A1    Sep. 8, 2016

(30) Foreign Application Priority Data

Mar. 5, 2015    (IT) .............................. TO2015A0148

(51) Int. Cl.
*H04R 1/08*    (2006.01)
*H04R 19/00*    (2006.01)
(Continued)

(52) U.S. Cl.
CPC ........... *H04R 1/086* (2013.01); *B81B 7/0058* (2013.01); *B81C 1/00309* (2013.01);
(Continued)

(58) Field of Classification Search
CPC ....................................................... H04R 1/086
(Continued)

(56) References Cited

U.S. PATENT DOCUMENTS

| 2004/0027671 A1* | 2/2004 | Wu ...................... G02B 26/001 359/578 |
| 2005/0085369 A1* | 4/2005 | Jensen .................... C03C 13/06 501/35 |

(Continued)

FOREIGN PATENT DOCUMENTS

| EP | 2 561 131 B1 | 6/2014 |
| WO | 2010/124899 A1 | 11/2010 |

(Continued)

*Primary Examiner* — Gerald Gauthier
(74) *Attorney, Agent, or Firm* — Seed Intellectual Property Law Group LLP

(57) ABSTRACT

A semiconductor integrated device, comprising: a package defining an internal space and having an acoustic-access opening in acoustic communication with an environment external to the package; a MEMS acoustic transducer, housed in the internal space and provided with an acoustic chamber facing the acoustic-access opening; and a filtering module, which is designed to inhibit passage of contaminating particles having dimensions larger than a filtering dimension and is set between the MEMS acoustic transducer and the acoustic-access opening. The filtering module defines at least one direct acoustic path between the acoustic-access opening and the acoustic chamber.

19 Claims, 7 Drawing Sheets

(51) Int. Cl.
  *H04R 19/04* (2006.01)
  *H04R 31/00* (2006.01)
  *B81B 7/00* (2006.01)
  *B81C 1/00* (2006.01)
(52) U.S. Cl.
  CPC ........... *H04R 19/005* (2013.01); *H04R 19/04* (2013.01); *H04R 31/00* (2013.01); *H04R 31/006* (2013.01); *B81B 2201/0257* (2013.01); *B81B 2203/0127* (2013.01); *B81B 2207/012* (2013.01); *B81B 2207/07* (2013.01); *B81C 2203/0785* (2013.01); *H01L 2224/48137* (2013.01); *H01L 2224/48227* (2013.01)
(58) Field of Classification Search
  USPC ........ 257/416; 381/113, 174, 337, 361, 316, 381/345; 181/135
  See application file for complete search history.

(56) References Cited

U.S. PATENT DOCUMENTS

| | | | | |
|---|---|---|---|---|
| 2005/0226784 | A1* | 10/2005 | Kobayashi | B01L 3/5023 436/514 |
| 2006/0254851 | A1* | 11/2006 | Karamuk | H04R 25/654 181/135 |
| 2009/0101505 | A1* | 4/2009 | Marino | B82Y 30/00 204/450 |
| 2010/0040250 | A1* | 2/2010 | Gebert | H04R 25/654 381/316 |
| 2010/0183181 | A1* | 7/2010 | Wang | H04R 19/005 381/361 |
| 2010/0246877 | A1* | 9/2010 | Wang | H04R 19/005 381/361 |
| 2010/0284553 | A1* | 11/2010 | Conti | B81B 7/0061 381/174 |
| 2011/0274299 | A1 | 11/2011 | Shaw et al. | |
| 2012/0148083 | A1* | 6/2012 | Knauss | H04R 19/04 381/361 |
| 2012/0237073 | A1 | 9/2012 | Goida et al. | |
| 2012/0280335 | A1* | 11/2012 | Zoellin | H04R 19/04 257/416 |
| 2013/0129133 | A1* | 5/2013 | Inoda | H04R 1/08 381/337 |
| 2014/0044297 | A1* | 2/2014 | Loeppert | H04R 1/04 381/355 |
| 2014/0140558 | A1* | 5/2014 | Kwong | H04R 3/007 381/345 |
| 2014/0169607 | A1* | 6/2014 | Goida | H04R 1/021 381/365 |
| 2015/0041930 | A1* | 2/2015 | Kim | H04R 19/005 257/416 |
| 2015/0264463 | A1* | 9/2015 | Kuzuyama | H04R 19/005 381/174 |
| 2016/0024290 | A1* | 1/2016 | Yamaguchi | C08F 285/00 523/201 |
| 2016/0261941 | A1* | 9/2016 | Brioschi | B81B 7/0058 |
| 2017/0006368 | A1* | 1/2017 | Brioschi | H04R 1/04 |

FOREIGN PATENT DOCUMENTS

| | | |
|---|---|---|
| WO | 2011/132062 A1 | 10/2011 |
| WO | 2013/097135 A1 | 7/2013 |

* cited by examiner

SEMICONDUCTOR INTEGRATED DEVICE FOR ACOUSTIC APPLICATIONS WITH CONTAMINATION PROTECTION ELEMENT, AND MANUFACTURING METHOD THEREOF

BACKGROUND

Technical Field

The present disclosure relates to a semiconductor integrated device, for acoustic applications, with a contamination protection element, and to the manufacturing method thereof. In particular, the semiconductor integrated device includes a MEMS acoustic transducer, and the contamination protection element is a filter adapted to protect the MEMS acoustic transducer from dust.

Description of the Related Art

In a known way, an acoustic transducer (in particular a microphone) of the MEMS (Micro-Electro-Mechanical System) type comprises a membrane sensitive structure designed to transduce acoustic-pressure waves into an electrical quantity (for example, a capacitive variation), and reading electronics designed to carry out appropriate processing operations (amongst which amplification and filtering operations) on said electrical quantity for supplying an electrical output signal (for example, a voltage) representing the acoustic-pressure wave received. In the case where a capacitive detection principle is adopted, the microelectromechanical sensitive structure in general comprises a mobile electrode, obtained as diaphragm or membrane, set facing a fixed electrode, for providing the plates of a variable-capacitance detection capacitor. The mobile electrode is anchored by a first, generally perimetral, portion thereof to a structural layer, whereas a second portion thereof, which is generally central, is free to move or bend in response to the pressure exerted by the incident acoustic-pressure waves. The mobile electrode and the fixed electrode thus provide a capacitor, and bending of the membrane that constitutes the mobile electrode causes a variation of capacitance, as a function of the acoustic signal to be detected.

With reference to FIG. 1, an acoustic-transducer device 19 is represented. The acoustic-transducer device 19 comprises a first die 21 that integrates a MEMS structure 1 provided with a membrane 2, mobile and of conductive material, which faces a rigid plate 3 (whereby is meant an element that is relatively rigid with respect to the membrane 2, which is, instead, flexible). The rigid plate 3 includes at least one conductive layer facing the membrane 2 so that the membrane 2 and the rigid plate 3 form facing plates of a capacitor.

The membrane 2, which in use undergoes deformation in response to incident acoustic-pressure waves, is at least partially suspended over a structural layer 5 and directly faces a cavity 6, obtained by forming a trench in a rear surface 5b of the structural layer 5 (the rear portion 5b is opposite to a front surface 5a of the same structural layer 5, set in the proximity of the membrane 2).

The MEMS structure 1 is housed in an internal cavity 8 of a package 20, together with a further die 22, of semiconductor material, which integrates a processing circuit, or ASIC (Application-Specific Integrated Circuit) 22'. The ASIC 22' is electrically coupled to the MEMS structure 1 by an electrical conductor 25', which connects respective pads 26' of the first and second dice 21, 22. The first and second dice 21, 22 are coupled side by side on a substrate 23 of the package 20. The first die 21 is coupled to the substrate 23 at the rear surface 5b of the structural layer 5, for example by an adhesive layer. Likewise, also the second die 22 is coupled to the substrate 23 at a rear surface 22b thereof. The ASIC 22' is provided on a front surface 22a of the second die 22, opposite to the rear surface 22b.

Appropriate metallization layers and vias (not shown in detail) are provided in the substrate 23 for routing the electrical signals onto the outside of the package 20. Further electrical connections 25", obtained with the wire-bonding technique, are provided between pads 26" of the second die 22 and respective pads 26" of the substrate 23.

Further coupled to the substrate 23 is a covering 27 of the package 20, which encloses the first and second dice 21, 22. Said covering 27 may be of metal or pre-molded plastic.

Electrical-connection elements 29, for example in the form of conductive lands, are provided at the underside of the substrate 23 (the side exposed outwards), for soldering and electrical connection to a printed-circuit board.

The substrate 23 further has a through opening, or hole, 28, which sets in fluid communication the cavity 6 of the first die 21 with the environment external to the package 20. The through opening 28 (in what follows referred to as "sound port") enables introduction of a flow of air from outside the package 20 and of the acoustic-pressure waves, which, impinging upon the membrane 2, deflect it.

In a known way, the sensitivity of the acoustic transducer depends upon the mechanical characteristics of the membrane 2 of the MEMS structure 1, and further upon the assembly of the membrane 2 and of the rigid plate 3. Further, the volume of the acoustic chamber formed by the cavity 6 directly affects the acoustic performance, determining the resonance frequency of the acoustic transducer.

Thus, multiple constraints are imposed on assembly of a MEMS acoustic transducer, which render design thereof particularly problematical, in particular where extremely compact dimensions are desired, as, for example, in the case of portable applications.

In order to protect the cavity 6 and the membrane 2 at least partially from dust and/or water and/or other debris that might penetrate through the through opening 28 thus reducing the useful dimensions of the cavity 6, and thus jeopardizing the performance of the acoustic transducer, it is known to provide a filter (illustrated only schematically in FIG. 1, and designated by the reference 30) outside the package 20 and facing the sound port 28 (at a distance therefrom). This filter 30 is, for example, coupled to a protective shell of a portable device (e.g., a cellphone) that houses the package 20.

In particular, in the case of portable applications, the package 20 is housed inside the protective shell of the portable device itself in such a way that the sound port 28 in turn faces a respective through opening, or hole, made through the protective shell of the portable device by interposition of the filter 30 itself. The filters currently used are mounted manually on the protective shell of the portable device and consequently present excessive dimensions with respect to the actual operating need, which is to protect exclusively the cavity 6, in addition, obviously, to the membrane 2 and the rigid plate 3.

Further, the filter 30 prevents entry of contaminating particles through the hole made through the protective shell of the portable device, but does not solve the problem of contamination deriving from particles of dust or other debris coming from various sources (for example, on account of a not perfectly hermetic closing of the protective shell). In particular, filters of the known type are altogether ineffective in regard to protection from contaminating agents during intermediate manufacturing and assembly steps, i.e., during steps of assembly of the package in the portable device.

BRIEF SUMMARY

One or more embodiments of the present disclosure may provide a solution to one or more of the problems illustrated previously.

According to one or more embodiments of the present disclosure a semiconductor integrated device with contamination protection element and a manufacturing method thereof are provided. In one embodiment a semiconductor integrated device comprising a package having a base element and a covering element jointly defining an internal space of the package is provided. The base element has an acoustic-access opening in acoustic communication with an environment external to the package. The integrated device further includes a MEMS acoustic transducer housed in the internal space of said package and including an acoustic chamber facing the acoustic-access opening. The integrated device further includes a filtering module that inhibits passage of contaminating particles having dimensions larger than a filtering dimension. The filtering module is set between the MEMS acoustic transducer and the acoustic-access opening. The filtering module forms at least one direct acoustic path between the acoustic-access opening and the acoustic chamber.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
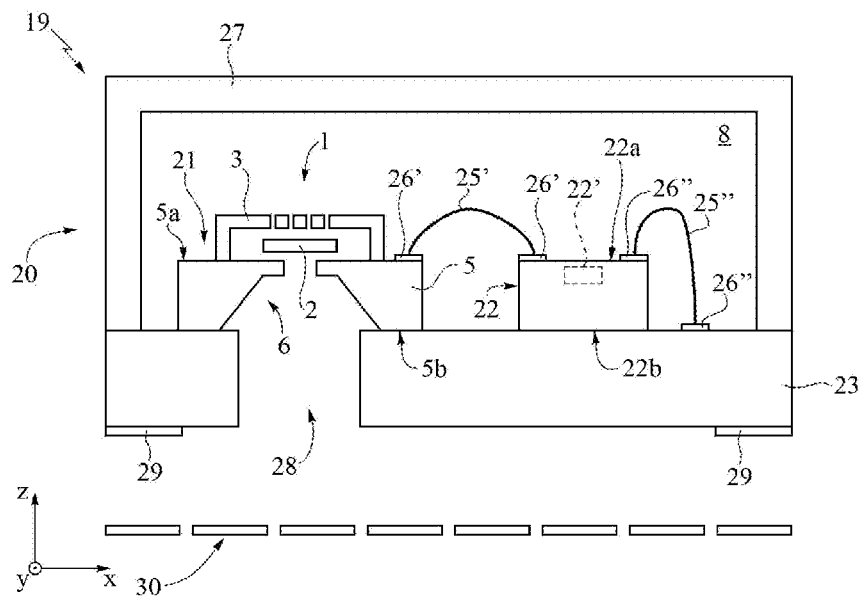
FIG. 1 shows a schematic cross-sectional view of a semiconductor integrated device including a MEMS acoustic transducer with the package thereof, according to an embodiment of a known type.
Figure 2:
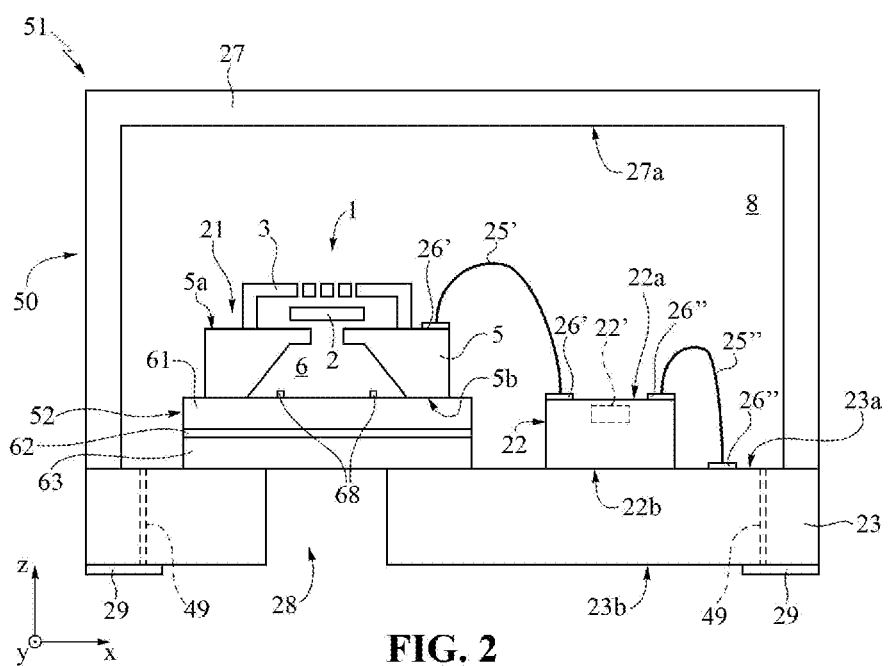
FIG. 2 shows a schematic cross-sectional view of a semiconductor integrated device including a MEMS acoustic transducer with the package thereof, according to one embodiment of the present disclosure.

FIG. 2 shows, in cross-sectional view, an acoustic-transducer device 51 according to one aspect of the present disclosure. Elements that are common to the acoustic-transducer device 51 of FIG. 2 and to the acoustic-transducer device 19 of FIG. 1 are designated by the same reference numbers and are not described any further.

In greater detail, the acoustic-transducer device 51 of FIG. 2 includes a package 50, formed by the base substrate 23 and by the covering element 27. The latter has a substantially cup-shaped conformation and is coupled to the base substrate 23 to form the cavity, or internal space, 8 of the package 50. Made through the entire thickness of the base substrate 23 is the through opening 28, which is designed to set the cavity 6 of the first die 21 in acoustic communication with the environment external to the package 50. In what follows, the through opening 28 will also be referred to as "sound port", and the cavity 6 of the first die 21 will also be referred to as "acoustic chamber". Further, the term "acoustic communication" is here used with the meaning of "direct acoustic communication", in the sense that generic sound waves, or acoustic-pressure waves, propagate in the environment considered using as only propagation medium air (or a possible gas, or mixture of gases, equivalent from the standpoint of propagation of sound).

The extension (in the horizontal plane xy) of the acoustic chamber 6 is greater than the extension thereof (once again in the horizontal plane xy) of the sound port 28, in such a way that the sound port 28 will communicate entirely with the acoustic chamber 6 without giving directly out into the internal space 8 of the package 50.

According to one aspect of the present disclosure, the acoustic chamber 6 of the first die 21 is in acoustic communication with the sound port 28 exclusively through a filtering module 52, which is set between the sound port 28 and the acoustic chamber 6 of the first die 21.

The first die 21, which houses the MEMS structure 1, is set on a top side 52a of the filtering module 52, in particular in such a way that the acoustic chamber 6 directly faces the filtering module 52. Thus, the filtering module 52 creates an obstacle for passage of dust and/or contaminating particles, coming from the environment external to the package 50, towards the acoustic chamber 6. The filtering module 52 has a plurality of through openings such that the flow of air and sound waves is not interrupted or sensibly degraded by the presence of the filtering module 52 itself. Acoustic communication of the acoustic chamber 6 towards the outside of the package 50 is thus provided.

The base substrate 23 is, for example, a multilayer structure, made up of one or more layers of conductive material (generally metal) separated by one or more dielectric layers (for example, bismaldehide-triazine (BT) laminate). Electrical paths 49 are provided through the base substrate 23 for connecting an inner surface 23a thereof, facing the internal space 8, to an outer surface 23b thereof, facing the external environment, that carries the electrical-connection elements 29. The latter are provided, in particular, in the form of lands (in the case of packages of the so-called LGA—Land-Grid Array—type, as is the case illustrated in FIG. 2). Alternatively, the lands 29 may be replaced by an array of "balls" or "bumps", thus providing a so-called BGA (Ball-Grid Array) package.

According to a different embodiment, the base substrate 23 does not comprise metal layers or conductive material in general and, for example, is of plastic material.

The covering element 27 may also be formed of multilayers, for example including one or more plastic and/or metal layers, and may advantageously present a metal coating (not illustrated) on an own inner surface 27a, facing the internal space 8, for providing an electromagnetic display. Alternatively, the covering element 27 is of metal.

The covering element 27 is further coupled to the base substrate 23 for sealing the internal space 8 hermetically.

Figure 3B:
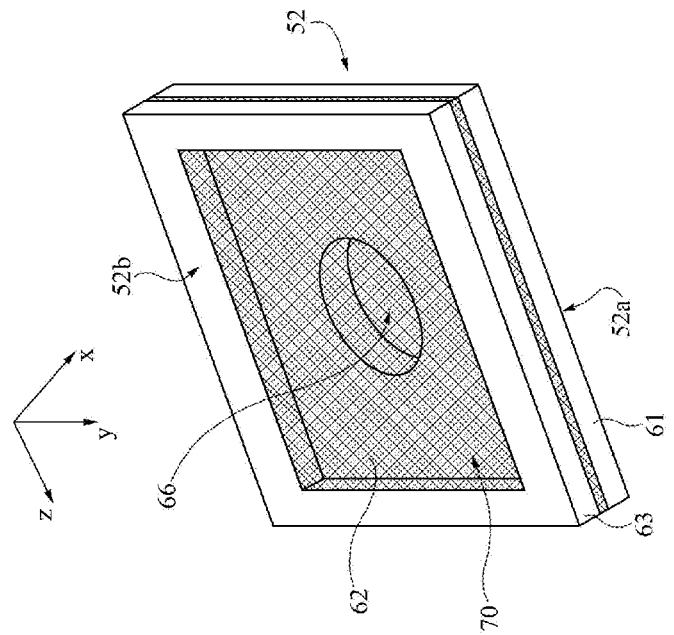
FIGS. 3A and 3B show a perspective view of a filtering module that may be coupled to a portion of the semiconductor integrated device of FIG. 2, according to one embodiment of the present disclosure.
Figure 3A:
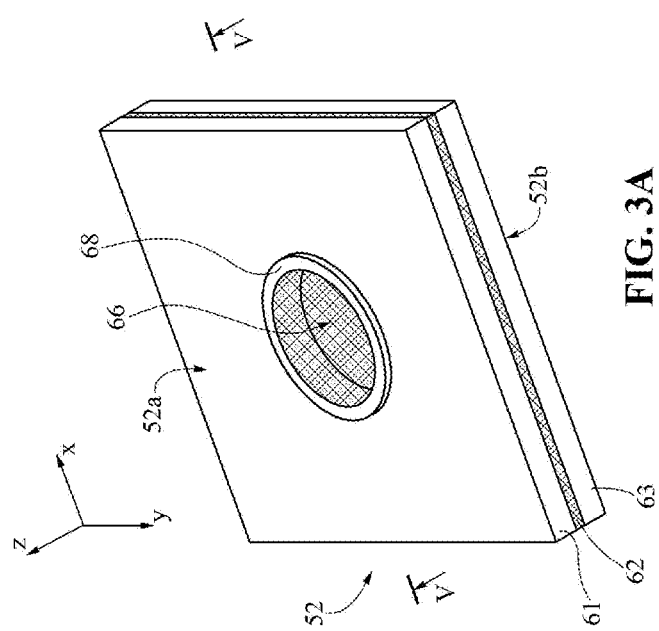

FIG. 3A shows, in perspective view, the filtering module 52, in which the top face 52a may be noted. FIG. 3B shows, in perspective view, the filtering module 52, in which a bottom face 52b, opposite to the top face 52a, may be noted.

With joint reference to FIGS. 3A and 3B, the filtering module 52 comprises: a top plate 61, the exposed surface of which forms the top face 52a of the filtering module 52, lying in a plane parallel to the plane xy; a bottom plate 63, the exposed surface of which forms the bottom face 52b of the filtering module 52, lying in a respective plane which is also parallel to the plane xy; and a filter 62, set between the top plate 61 and the bottom plate 63. In other words, the filter 62 is set, or "sandwiched", between the top plate 61 and the bottom plate 63.

With reference to FIG. 3A, the top plate 61 has a through opening 66, here of a circular shape, through which a portion of the filter 62 is exposed. The through opening 66 has dimensions such that, when the filtering module 52 is set underneath the first die 21, as shown in FIG. 2, the through opening 66 is completely contained within the acoustic chamber 6. In other words, the rear surface 5b of the structural layer 5 is coupled to the surface of the top plate 61 (top face 52a) that surrounds the through opening 66 on the outside.

Optionally, the through opening 66 is surrounded by a ring 68, in relief, having the function of preventing entry into the through opening 66 of any possible glue used for fixing the first die 21 and the filtering module 52 together. The ring 68 may be replaced by a trench, or else by a region, substantially coplanar to the top face 52a, of hydrophobic material, that is to react with water-based glues in order to prevent penetration of said glues into the through opening 66. In this case, when the filtering module 52 is set underneath the first die 21 as in FIG. 2, both the through opening 66 and the ring 68 are completely contained within the acoustic chamber 6. In other words, the rear surface 5b of the structural layer 5 is coupled to the surface of the top plate 61 (top face 52a) that surrounds the ring 68 on the outside.

With reference to FIG. 3B, also the bottom plate 63 has a through opening 70, here by way of example represented as being of a square shape, through which a respective portion of the filter 62 is exposed. The through opening 70 has a diameter greater than the diameter of the through opening 66. In particular, the center of the geometrical shape defined by the through opening 66 (here, a circle) and the center of the geometrical shape defined by the through opening 70 (here, a square), are located on a same axis z orthogonal to the plane xy. In other words, observing the through opening 66 and the through opening 70 in the plane xy, it may be noted that the through opening 66 is completely contained within the through opening 70.

Figure 4:
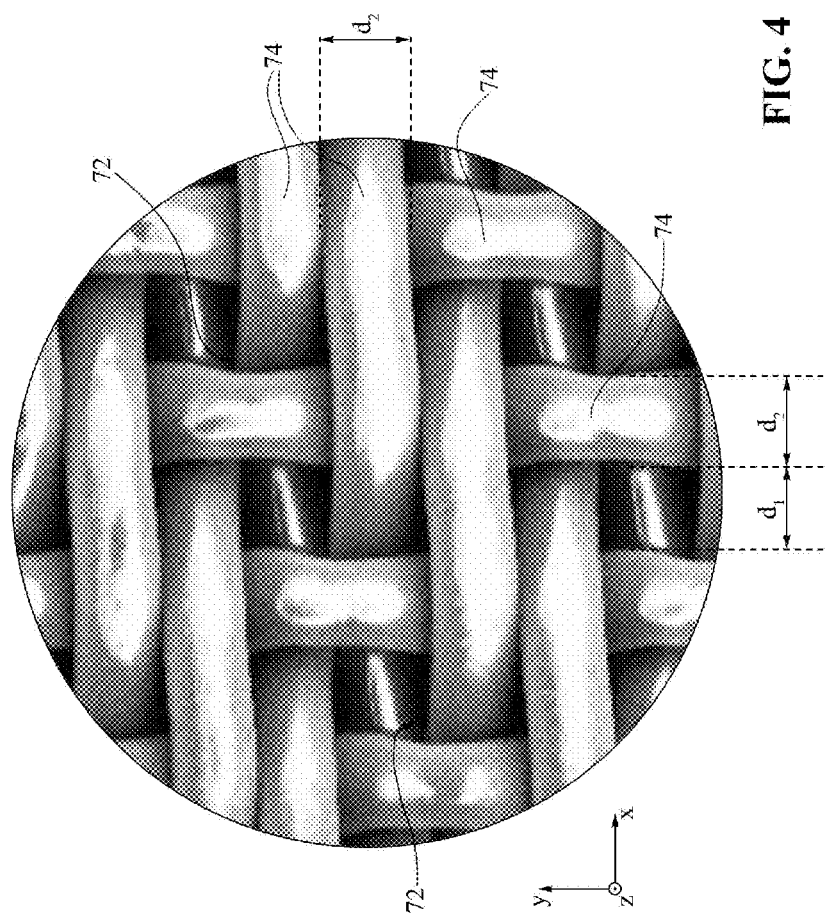
FIG. 4 shows an enlarged detail of a filter belonging to the filtering module of FIGS. 3A and 3B.

FIG. 4 shows, by way of example, an enlarged portion of the filter 62. In this embodiment, the filter 62 is a fabric made up of threads 74 that form a weave such as to define through openings 72 of maximum dimension $d_1$, measured along the axis x and/or the axis y, comprised between 5 and 40 μm, in particular comprised between 15 and 25 μm. The threads 74 that form the weave have a thickness $d_2$, measured along the axis x and/or the axis y, that is some tens of micrometers, for example approximately 40 μm.

The filter 62 is of a material chosen according to the desire, for example obtained using threads 74 of PET (Polyethylene terephthalate), or thermoplastic organic polymers such as for example poly-ether-ether-ketone (PEEK), or some other material. A fabric suitable for the purpose is commercially available and marketed under the trade name "Acoustex", manufactured by Saati S.p.A.

The first and second plates 61, 63 are of semiconductor material, such as silicon, or else of metal material, such as stainless steel. However, any other material compatible with MEMS microprocessing and suitable to be processed to form the first and second plates 61, 63 may be used, according to the desire, for example a plastic material.

Figure 5A:
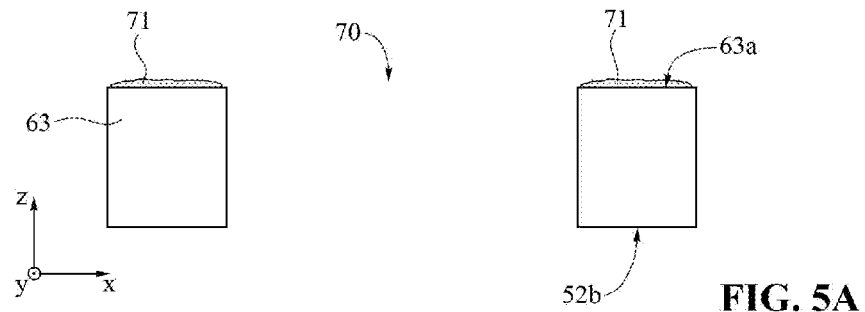
FIGS. 5A-5C show, in lateral section, steps for manufacturing the filtering module of FIGS. 3A and 3B.
Figure 5B:
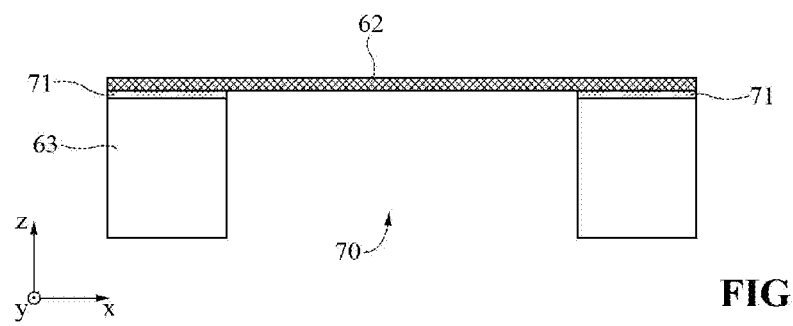
Figure 5C:
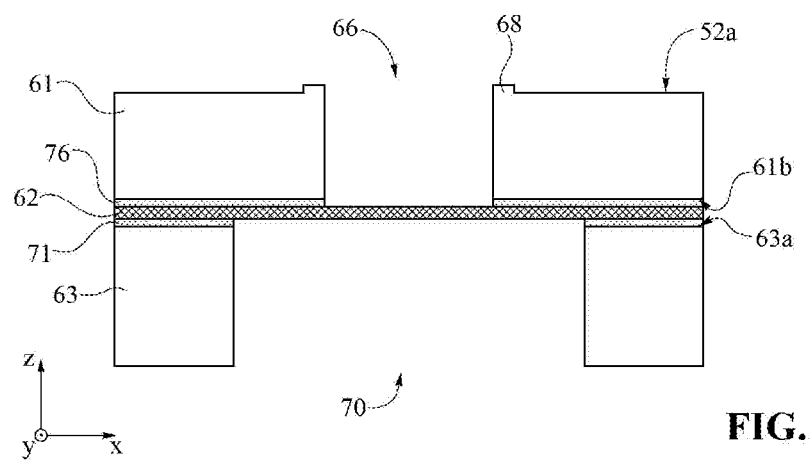

With reference to the steps for manufacturing the filtering module 52, these are illustrated by way of example with reference to FIGS. 5A-5C, which show a lateral-sectional view, taken along the line of cross-section V-V of FIG. 3A, of the filtering module 52 during processing steps.

With reference to FIG. 5A, the second plate 63 is provided, and the through opening 70 is made therein (for example, with an etching step in the case of use of semiconductor material, or a punching step in the case of a plate 61 of stainless steel, or using an "injection molding" tool to obtain a plate 63 of plastic material). A layer of glue 71 is dispensed over a surface 63a of the second plate 63. The surface 63a is opposite to the surface of the second plate 63 that, at the end of the manufacturing process, forms the bottom face 52b of the filtering module 52. The layer of glue is, for example, a non-conductive epoxy glue, or silicone, and is obtained by dispensing the glue in a peripheral region of the surface 63a of the second plate 63, in such a way that the glue will not penetrate within the through opening 70. On the other hand, it may be noted that, even in the case where a modest amount of glue were to penetrate into the through opening 70, this would not constitute a problem. As an alternative to glue, it is possible to use a biadhesive tape, appropriately shaped.

With reference to FIG. 5B, a fabric of the type previously described is provided and cut to form the filter 62. The fabric is cut so that it will assume, in the plane xy, the perimetral shape and dimensions of the top surface 63a of the second plate 63. The filter 62 thus formed is stretched, and the layer of glue 71 is brought into contact with the filter 62, and gluing is carried out.

As an alternative to what has been described, it is further possible to stretch the fabric, and glue it to the second plate 63 prior to cutting of the fabric itself. In this case, cutting of the fabric is carried afterwards, in any one of the subsequent manufacturing steps.

With reference to FIG. 5C, the first plate 61 is provided and made therein is the through opening 66 (following the same procedure as the one adopted to form the opening 70 in the second plate 63). In this step, it is further possible to form the ring 68 (or, alternatively, the trench or the hydrophobic region, here not shown).

A layer of glue 76 is dispensed over the surface 61b of the first plate 61. Said surface 61b is opposite to the surface of the first plate 6, which, at the end of manufacturing, forms the top face 52a of the filtering module 52. The layer of glue is, for example, a non-conductive epoxy glue, or silicone, and is formed by dispensing the glue over a peripheral region of the surface 61b of the first plate 61, in such a way that the glue does not penetrate into the through opening 66. Alternatively, it is further possible to use a biadhesive tape, appropriately shaped. In this case, the ring 68 is not necessary in so far as there is no risk of penetration of the glue into the through opening 66.

The step of dispensing of glue over the surface 61b of the first plate 61 may further be omitted in the case where the amount of glue dispensed over the second plate 63 is such that said glue, as a result of pressure between the filter 62 and the second plate 63, flows into the through openings 72 of the filter, and reaches the opposite surface, i.e., the surface of the filter that is set in direct contact with the first plate 61. Also in this case, the ring 68 may be omitted.

The filtering module 52 of FIGS. 3A and 3B is thus obtained.

It is evident that, in a per se known manner, the steps of FIGS. 5A-5C may be carried out simultaneously for a plurality of filtering modules 52, formed alongside one another on a same wafer of semiconductor material (or metal, or plastic material, according to respective embodiments). In this case, in a way not shown in the figure, in a wafer a plurality of through openings 70 are formed, alongside one another and at a distance from one another, to form for example an array structure. A fabric is stretched over the entire top surface of the first wafer and coupled thereto (e.g., by gluing). In a respective further wafer, a plurality of through openings 66 are formed, alongside one another and at a distance from one another, to form the array structure. The two wafers are coupled together (as described with reference to FIG. 5C), thus fixing the fabric in between. Finally, a cutting step is carried out, for isolating a plurality of filtering modules 62 of the type shown in FIGS. 3A and 3B.

Integration of the filtering module 52 in the package 50 is obtained by using the known MEMS microprocessing techniques.

In greater detail, after the base substrate 23 has been processed (in particular after the sound port 28 is formed), the filtering module 52 is coupled to the surface 23a of the substrate 23 by glue dispensed on the rear face 52b, for example a non-conductive epoxy glue, or silicone, or else by a biadhesive tape, appropriately shaped so as not to occlude the through openings of the filter. An adequate amount of glue is further dispensed on the top face 52a, alongside the through opening 66 and the ring 68 (if present), and physical coupling of the first die 21 to the filtering module 52 is carried out. As an alternative to the glue, it is possible to use a biadhesive tape appropriately shaped so as not to occlude the through openings of the filter.

The structure of FIG. 2 is thus obtained, in which the first die 21 is housed in the cavity 8 of the package 51 over the filtering module 52, and the acoustic chamber 6 is in acoustic communication with the environment external to the package 51 via the filter 62.

Figure 6:
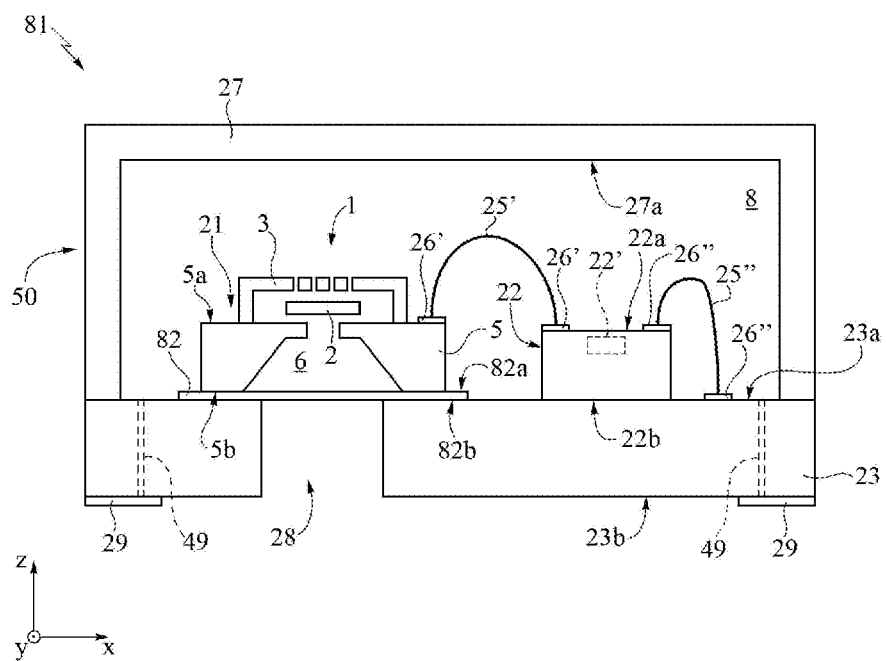
FIG. 6 shows a schematic cross-sectional view of a semiconductor integrated device including a MEMS acoustic transducer with the package thereof, according to a further embodiment of the present disclosure.

FIG. 6 shows an acoustic-transducer device 81 according to a further embodiment.

The acoustic-transducer device 81 is similar to the acoustic-transducer device 51 of FIG. 2. Elements that are in common are thus not described further and are designated by the same reference numbers.

The acoustic-transducer device 81 differs from the acoustic-transducer device 51 in that it has a filtering module 82 of a different type. In particular, the filtering module 82 is formed starting from a wafer of semiconductor material, for example silicon, appropriately processed to form, through said wafer, a plurality of through openings of dimensions such as to prevent passage of the contaminating particles that are to be blocked. In other words, the filtering module 82 is in the form of a membrane having a plurality of holes. The thickness of the filtering module 82 is comprised in the interval 80-120 μm, for example 100 μm.

Since the filtering module 82, according to this embodiment, is of semiconductor material, it is not necessary to set it between two plates as described with reference to the filter 62 of FIGS. 3A and 3B, in so far as it presents good characteristics of stiffness and strength. In this case, the filtering module 82 itself constitutes the filter and is set between the acoustic chamber 6 of the first die 21 and the sound port 28 without the aid of further supporting means.

Figure 7:
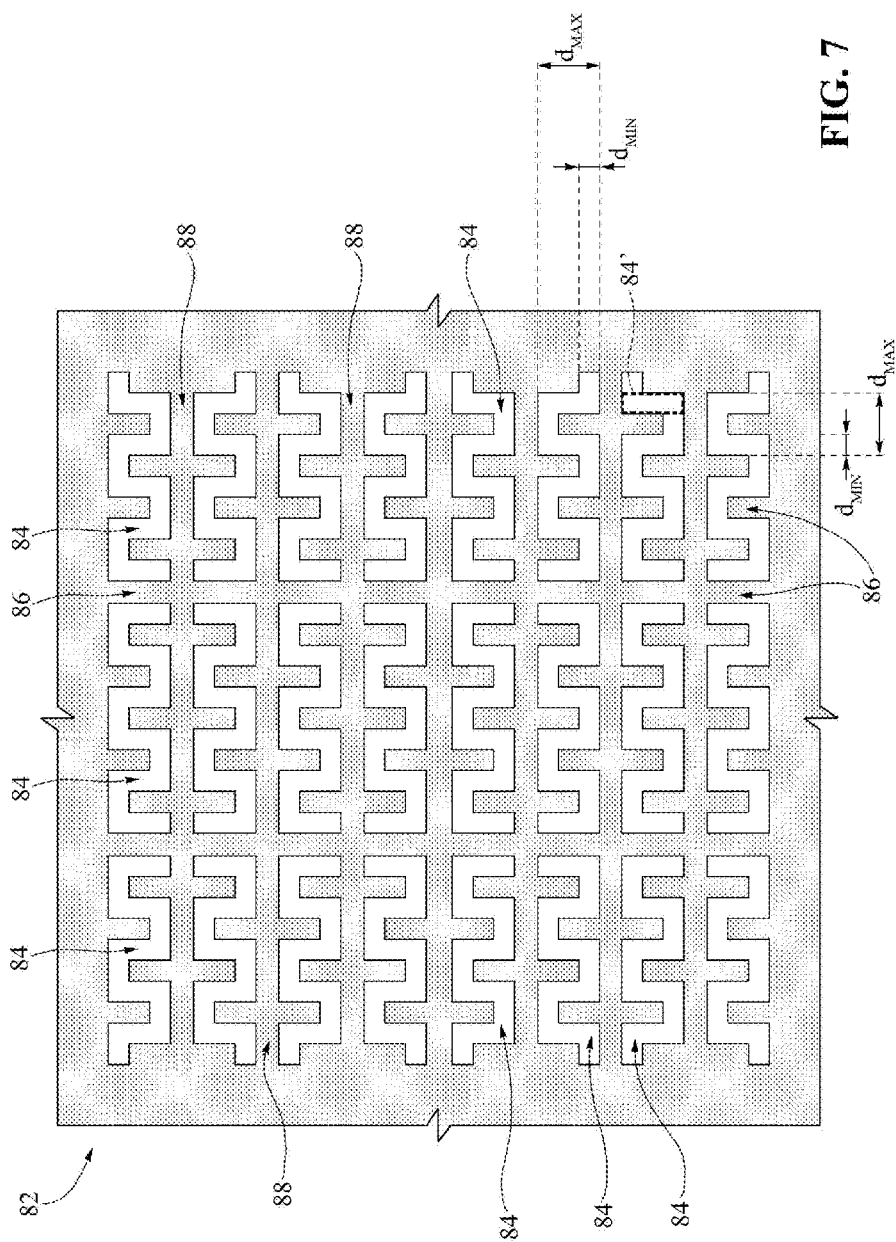
FIG. 7 shows a filtering module that may be coupled to a portion of the semiconductor integrated device of FIG. 6, according to the respective embodiment.

FIG. 7 shows, in top plan view in the plane xy, a filtering module 82 that may be used in the production of the acoustic-transducer device 81, according to one embodiment of the present disclosure. The filtering module 82 of FIG. 7 has filtering openings 84, which extend throughout the thickness of the filtering module 82, and form a serpentine path. Said serpentine path comprises, in particular, a plurality of sub-openings 84' of a substantially rectangular shape, which are fluidically connected together (a sub-opening 84' is represented with a dashed line in FIG. 7, so that it may be identified more clearly). Each sub-opening 84' has a respective main extension $d_{MAX}$ (major side of the rectangle) along one of the axes x or y, and a secondary extension $d_{MIN}$ (minor side of the rectangle) along the other between the axes x and y.

Two consecutive sub-openings 84' fluidically coupled together form substantially an L, and a plurality of consecutive sub-openings 84' fluidically coupled together form the aforesaid serpentine geometrical shape.

More in particular, the main extension $d_{MAX}$ of each sub-opening 84' (length), measured along the respective reference axis x or y, has a value comprised between 30 μm and 90 μm, for example equal to 45 μm. The secondary extension $d_{MIN}$ of each sub-opening (width) has a value, measured along the respective reference axis y or x orthogonal to the respective axis x or y of main extension, in the interval comprised between 5 μm and 30 μm, more in particular between 10 μm and 20 μm, for example 15 μm.

The filtering module 82 comprises a plurality of serpentine through openings, separated from one another, along x and y, by respective first and second intermediate interruption regions 86, 88. The first intermediate interruption regions 86 have a main extension parallel to the axis y, and the second intermediate interruption regions 88 have a main extension parallel to the axis x.

The first and the second intermediate interruption regions 86, 88 are full regions, i.e., they do not have through openings, and have the function of improving the strength of the filtering module 82, in order to reduce the probability of undesired failure thereof. Also the serpentine shape described is deemed, by the present applicant, suited to guaranteeing a good filtering power together with a good resistance to failure.

It is however evident that other embodiments may be provided for the filtering module 82, for example having, as an alternative to the serpentine through openings, rounded or quadrangular holes set to form an array, or set according to any other pattern. More in general, the through openings of the filtering module 82 may have a generic geometrical shape chosen freely according to the desire. In order to guarantee a good filtering, it is in any case advisable for said through openings, whatever their geometrical shape, to present a maximum dimension equal to the values indicated for $d_{MAX}$.

In order to guarantee good filtering and at the same time good strength of the filtering module 82, the ratio between the area occupied by the trench regions and the area occupied by the full regions of the portion of the filtering module 82 effectively used for the filtering purposes (i.e., of the portion of the filtering module 82 directly facing the acoustic chamber 6 of the first die 21) is chosen in the interval 1-2 (where "1" means that 50% of the area of the filtering module 82 is occupied by the filtering openings 84 and the remaining 50% of the area is occupied by the first and second intermediate interruption regions 86, 88, and "2" means that the filtering openings 84 occupy twice the area occupied by the first and second intermediate interruption regions 86, 88). The present applicant has noted that said ratio affords a good compromise between strength of the filtering module 82 and access to the acoustic chamber 6 by sound waves coming from the environment external to the package.

Mechanical coupling of the filtering module 82 to the base substrate 23 is obtained, according to one embodiment, by dispensing a layer of glue (not shown) over peripheral regions of the filtering module 82, in particular on both of the faces 82a, 82b of the filtering module 82 in surface regions of the faces 82a, 82b that, in use, are set in contact with the structural layer 5 of the first die 21 and, respectively, with the base substrate 23. In a per se known manner, the glue is not dispensed in regions of the filtering module 82 that, in use, directly face the acoustic chamber 6 and the through opening 28.

As an alternative to the glue, it is possible to use a biadhesive tape, appropriately shaped that does not block the through openings of the filter.

By gluing, the filtering module 82 is coupled on the base substrate 23 so that the filtering module 82 extends to cover the sound port 28 with the face 82b; by gluing, the first die 21 is coupled on the filtering module 82 so that the acoustic chamber 6 gives completely out onto the face 82a of the filtering module 82 and is in acoustic communication with the sound port 28 through the filtering openings 84.

It is evident that it is possible, as an alternative, to couple together the first die 21 and the filtering module 82 prior to the step of coupling of the filtering module 82 to the base substrate 23.

Relative coupling between the through opening 28, the filtering module 82, and the first die 21 shown in FIG. 6 is thus obtained.

According to a further embodiment, filtering module 82 comprises a surface layer of hydrophobic material, for example silicon carbide or Teflon. The hydrophobic layer is obtained, for example, with a sputtering technique, after the step of etching for formation of the filtering openings 84. Since the hydrophobic layer does not require a particularly large thickness (from some hundreds of nanometers up to a few micrometers), the sputtering step carried out after formation of the through openings does not block said through openings significantly.

The hydrophobic layer thus formed has the function of inhibiting entry of water into the acoustic chamber 6 of the first die 21. For this purpose, it is sufficient for the hydrophobic layer to extend alongside the filtering module 82 facing the outside of the package 50. In this case, the hydrophobic layer forms the face 82b of the filtering module 82.

Figure 8:
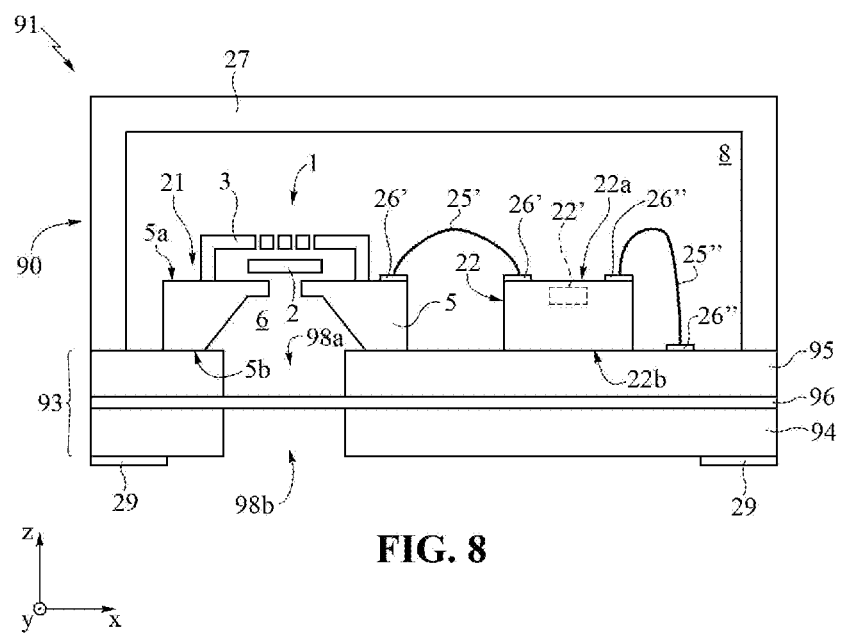
FIG. 8 shows a schematic cross-sectional view of a semiconductor integrated device including a MEMS acoustic transducer with the package thereof, according to a further embodiment of the present disclosure.

FIG. 8 shows an acoustic-transducer device 91, provided with a package 90, according to a further embodiment. Elements of the acoustic-transducer device 91 that are in common to the acoustic-transducer device 19 of FIG. 1 are designated by the same reference numbers and are not described any further. According to the embodiment of FIG. 8, a base supporting substrate 93 (corresponding, from a structural standpoint, to the substrate 23 of FIG. 1) supports the first and second dice 21, 22. The base supporting substrate 93 is formed by two supporting elements 94, 95, extending between which is a filter 96, in particular a filtering fabric that has the characteristics already described with reference to FIGS. 2, 3A and 3B and is coupled between the two supporting elements 94, 95 in a way similar to what has been described with reference to FIGS. 5A-5C. The supporting element 94 extends between the filter 96 and the environment external to the package 90, whereas the supporting element 95 extends between the filter 96 and the cavity 8 internal to the package 90.

According to one embodiment, the supporting element 94 is an LGA (land grid array) substrate (provided with the lands 29 for electrical connection towards the outside environment), and the support element 95 is a generic semiconductor substrate, having purposely provided metallization layers and vias (not shown in detail) for routing the electrical signals towards the outside of the package.

Through openings 98a and 98b extend, mutually aligned along the z axis, through the supporting elements 94, 95 and are fluidically connected together through the filter 96. The through openings 98a and 98b form a sound port in a way similar to the through opening 28 described previously.

Figure 9:
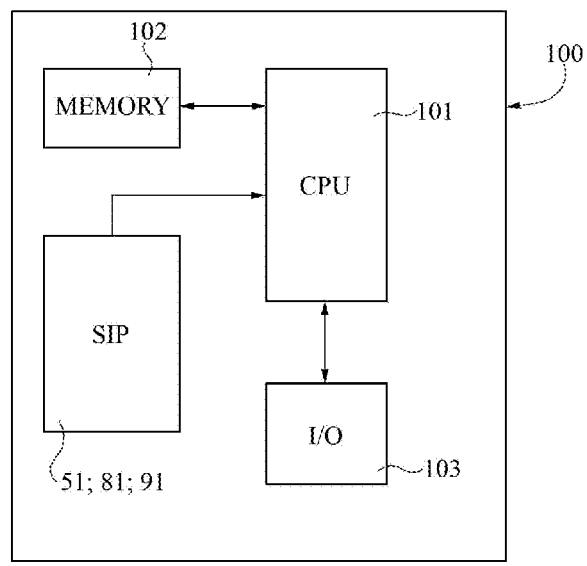
FIG. 9 shows an electronic device including a semiconductor integrated device according to any one of the embodiments of FIGS. 2, 6, and 9.

FIG. 9 shows an electronic device 100 that uses the acoustic-transducer device 51, 81, 91 according to the respective embodiment of FIGS. 2, 6, and 8, obtained as illustrated previously in the form of SIP (System in Package).

The electronic device 100 comprises, in addition to at least one of the acoustic-transducer devices 51, 81, 91, a microprocessor (CPU) 101, a memory block 102 connected to the microprocessor 101, and an input/output interface 103, for example a keyboard and/or a display, which is also connected to the microprocessor 101.

The at least one of the acoustic-transducer devices 51, 81, 91 communicates with the microprocessor 101, and in particular transmits the electrical signals processed by the ASIC 22' of the die 22 associated to the MEMS detection structures of the die 21.

The electronic device 100 is, for example, a mobile communication device, such as, for instance, a cellphone, a PDA (personal digital assistant), a notebook, but also a voice recorder, an audio-file reader with voice-recording capacity, a console for videogames, a wearable device, such as a watch, a hydrophone, etc.

The advantages of the assembly proposed for an integrated acoustic device emerge clearly from the foregoing description.

In particular, it is once again emphasized that the assembly described enables integration, within a same package, of a MEMS acoustic transducer and a filter designed to protect said MEMS acoustic transducer from contamination of particles of dimensions equal to some micrometers, or some tens, of micrometers coming from the environment external to the package.

It is thus possible to reduce the occupation of space and provide a complete system, having a filtering function, within a single package.

Finally, it is clear that modifications and variations may be made to what has been described and illustrated herein, without thereby departing from the scope of the present disclosure.

In particular, as already highlighted, there may be envisaged a different configuration of the MEMS acoustic transducer, in particular with regards to the geometrical shape of the constitutive elements. In the case where the space internal to the package so allows, there may be housed inside the package itself also a number of MEMS sensors in addition to the MEMS acoustic transducer, each possibly provided with a sensitive element that is in communication with the external environment. Further integrated circuits (e.g., ASICs) may further be provided and housed inside the same package.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
a package body having a base element and a covering element jointly defining an internal space of the package body and outer surfaces of the semiconductor package, said base element having an acoustic-access opening in acoustic communication with an environment external to the package body;
a MEMS acoustic transducer housed in the internal space of said package body and including an acoustic chamber facing the acoustic-access opening; and
a filtering module coupled to the package body and covering the acoustic-access opening, the filtering module being configured to inhibit passage of contaminating particles having dimensions larger than a filtering dimension, the filtering module being located between the MEMS acoustic transducer and the acoustic-access opening, said filtering module forming at least one direct acoustic path between the acoustic-access opening and the acoustic chamber.

2. The semiconductor package according to claim 1, wherein said filtering dimension is between 10 μm and 35 μm.

3. The semiconductor package according to claim 1, wherein said filtering module includes a filtering fabric having a plurality of threads interwoven according to a pattern that defines through openings of maximum dimension equal to said filtering dimension.

4. The semiconductor package according to claim 1, wherein the base element includes a first substrate having said acoustic-access opening that extends through an entire thickness of the first substrate, and a second substrate having a hole that extends through an entire thickness of the second substrate, said filtering fabric being integrated in the base element between the first and second substrates,
wherein the first substrate, the second substrate, and the filtering fabric are coupled together in such a way that the acoustic-access opening and the hole are in direct acoustic connection with one another by the through openings of the filtering fabric.

5. The semiconductor package according to claim 3, wherein the filtering module includes a first supporting plate and a second supporting plate provided with respective first and second windows, said filtering fabric being located between the first and second supporting plates in such a way that the first and second windows expose the same through openings of the filtering fabric,
and wherein the filtering module is housed in the internal space of the package so that the through openings directly face the acoustic chamber and the acoustic-access opening, thereby defining a direct acoustic path for an acoustic wave that propagates from the acoustic-access opening to the acoustic chamber through the second window, the first window, and the through openings.

6. The semiconductor package according to claim 1, wherein said filtering module is a membrane of semiconductor material having a plurality of through openings,
said filtering module being completely housed in the internal space of the package so that the through openings directly face the acoustic chamber and the acoustic-access opening, thereby defining a direct acoustic path for an acoustic wave that propagates from the acoustic-access opening to the acoustic chamber through said through openings.

7. The semiconductor package according to claim 6, wherein said through openings have a serpentine profile.

8. The semiconductor package according to claim 1, wherein:
the MEMS acoustic transducer includes a structural layer having a front surface and a membrane at the front surface of the structural layer that flexes in response to sound waves, the structural layer having a rear portion, said acoustic chamber extending through said rear portion to said membrane; and
the rear portion of said structural layer is coupled to said filtering module and, the filtering module is coupled to an inner wall of said base element surrounding said acoustic-access opening.

9. The semiconductor package according to claim 1, wherein said package further includes, in the internal space, a second die integrating a first ASIC electronic circuit functionally coupled to the MEMS acoustic transducer to receive and process a signal generated by the MEMS acoustic transducer as a function of an acoustic-pressure wave received by the MEMS acoustic transducer through said direct acoustic path.

10. The semiconductor package according to claim 1, wherein said filtering module, along said direct acoustic path, is hydrophobic.

11. An electronic device, comprising:
a microprocessor; and
a semiconductor package coupled to the microprocessor, the semiconductor package including:
a package body defining an outer surface of the semiconductor package and an internal space, the package body having an acoustic-access opening in acoustic communication with an environment external to the package body;
a MEMS acoustic transducer housed in the internal space of the package body and having an acoustic chamber facing the acoustic-access opening of the package body; and
a filtering module coupled to the package body and located between the MEMS acoustic transducer and at least a portion of the acoustic-access opening, the filtering module configured to inhibit passage of contaminating particles having dimensions larger than a filtering dimension, the filtering module forming an acoustic path between the acoustic-access opening and the acoustic chamber.

12. The electronic device according to claim 11, wherein the electronic device is at least one of a cellphone, a PDA, a notebook, a voice recorder, an audio-file reader with voice-recorder function, a console for videogames, a hydrophone, and a wearable device.

13. The electronic device according to claim 11, wherein the filtering module includes a filtering fabric having a plurality of threads interwoven according to a pattern that defines through openings of maximum dimension equal to said filtering dimension.

14. The electronic device according to claim 11, wherein said filtering module is a membrane of semiconductor material having a plurality of through openings.

15. A method for assembling a semiconductor package, the method comprising:
    housing a MEMS acoustic transducer that includes an acoustic chamber in an internal space of a package body in such a way that the acoustic chamber faces an acoustic-access opening of the package body; and
    arranging a filtering module configured to inhibit passage of contaminating particles having dimensions larger than a filtering dimension between the MEMS acoustic transducer and at least a portion of the acoustic-access opening to form a direct acoustic path between the acoustic-access opening and the acoustic chamber through the filtering module,
    wherein the arranging comprises housing, between the MEMS acoustic transducer and the acoustic-access opening, a filtering fabric having a plurality of threads interwoven according to a pattern that defines through openings of a maximum dimension equal to said filtering dimension.

16. The method according to claim 15, wherein the base element comprises a first substrate having said acoustic-access opening that extends throughout the thickness of the first substrate, and a second substrate having a hole that extends throughout the thickness of the second substrate,
    wherein the step of arranging the filtering module comprising the steps of:
        integrating said filtering fabric between the first and second substrates; and
        coupling together the first substrate, the second substrate, and the filtering fabric in such a way that the acoustic-access opening and the hole are in direct acoustic connection with one another through the through openings of the filtering fabric.

17. The method according to claim 15, further comprising the step of manufacturing said filtering module, including the sub-steps of:
    forming a first window in a first supporting plate;
    forming a second window in a second supporting plate; and
    setting the filtering fabric between the first supporting plate and the second supporting plate in such a way that the first window and the second window expose the same through openings of the filtering fabric, thereby defining the acoustic path for an acoustic wave to propagate from the second window to the first window through said through openings.

18. A method for assembling a semiconductor package, the method comprising:
    housing a MEMS acoustic transducer that includes an acoustic chamber in an internal space of a package body in such a way that the acoustic chamber faces an acoustic-access opening of the package body;
    forming a filter module by processing a semiconductor wafer to form a membrane of semiconductor material having a plurality of through openings, wherein said through openings have a serpentine profile; and
    coupling the filtering module to package body and covering the acoustic-access opening, the filter module being configured to inhibit passage of contaminating particles having dimensions larger than a filtering dimension between the MEMS acoustic transducer and at least a portion of the acoustic-access opening to form a direct acoustic path between the acoustic-access opening and the acoustic chamber through the filtering module.

19. The method according to claim 18, wherein coupling the filter module to package body comprises coupling the filter module to an internal surface of the package body.

* * * * *